United States Patent [19]
Finley et al.

[11] 4,401,887
[45] Aug. 30, 1983

[54] REDUCING FLARE IN SELF-SCANNED PHOTOSENSOR ARRAYS

[75] Inventors: Jack D. Finley, Acton; Robert E. Whitney, Burlington, both of Mass.

[73] Assignee: Eikonix Corporation, Bedford, Mass.

[21] Appl. No.: 192,719

[22] Filed: Oct. 1, 1980

[51] Int. Cl.³ .............................................. H01J 5/16
[52] U.S. Cl. ..................... 250/216; 250/578; 350/276 R
[58] Field of Search .................... 250/211 R, 216, 226, 250/551, 578, 577; 350/163, 164, 276 R; 356/447

[56] References Cited

U.S. PATENT DOCUMENTS

| | | | |
|---|---|---|---|
| 2,215,211 | 9/1940 | Devol | 356/447 |
| 2,976,763 | 3/1961 | McKeag | 250/577 X |
| 3,462,605 | 8/1969 | Engeler | 250/551 X |
| 3,711,722 | 1/1973 | Kavanagh | 250/216 |
| 4,045,120 | 8/1977 | de Corlieu et al. | 250/551 X |
| 4,047,804 | 9/1977 | Stephens | 350/164 |
| 4,112,308 | 9/1978 | Olschewski et al. | 250/551 |

OTHER PUBLICATIONS

Strickland, "Low-Reflection Coatings on Glass", International Projectionist, Sep. 1947; pp. 10-12, 34-35.

*Primary Examiner*—David C. Nelms
*Assistant Examiner*—Edward P. Westin
*Attorney, Agent, or Firm*—Charles Hieken

[57] ABSTRACT

Undesired reflections in a photosensor array encapsulated in a glass-covered housing are reduced by including between the cover and photosensor array a solid or fluid adapted to substantially match the index of refraction of the cover.

10 Claims, 2 Drawing Figures

REDUCING FLARE IN SELF-SCANNED PHOTOSENSOR ARRAYS

BACKGROUND OF THE INVENTION

1. Field of the Invention

This invention relates to photosensor arrays and more particularly to a photosensor array encapsulated in a housing arranged to be relatively insensitive to undesired reflections.

2. Description of the Prior Art

Referring to FIG. 1 there is shown a cross-sectional view of a prior art self-scanned photosensor array 10 of the type used in high quality image detecting applications. The array 10 includes a plurality of photosensors, such as known photodiodes, deposited on a dielectric substrate 11. Each of the photosensors produces a photoelectric effect in response to an incident beam of light. The array 10 and associated integrated electrical circuitry are usually encapsulated in a plastic case 14 equipped with external connecting means 12 and covered with a sheet of transparent material 16, such as glass. A cavity or space 18 is formed between a back surface 20 of the glass cover 16 and the array 10. As a result of this construction, first 22 and second 24 glass-air interfaces are provided. When light rays from an image are incident on a front surface 26 of the glass cover 16 at an angle, the rays are refracted, and some reflection occurs at both the front surface 26 of the glass cover 16 and the array 10 itself. The light not absorbed by the array 10 is reflected to the back surface 20 of the glass cover 16 where it is again subject to a combination of penetration and reflection. Multiple reflections or flare can occur to cause an appreciable amount of light to be scattered within the case 14, and impair the resolution capabilities of an image scanning system comprising the array 10 to produce images of apparent reduced contrast.

Accordingly, it is an important object of the invention to provide a photosensor array with improved resolution.

It is another object of the invention to achieve the preceding object with apparatus that is relatively inexpensive, compact and reliable.

SUMMARY OF THE INVENTION

According to the invention there is a housing having a cover of transparent material with a predetermined index of refraction. An array of photosensors is deposited in a space within the housing beneath the cover. Means for matching the index of refraction of the cover is deposited in the space between the cover and photosensor to reduce internal reflections in the housing.

Numerous other features, objects and advantages of the invention will become apparent from the following specification when read in conjunction with the accompanying drawing in which:

DESCRIPTION OF THE PREFERRED EMBODIMENTS

Figure 1:
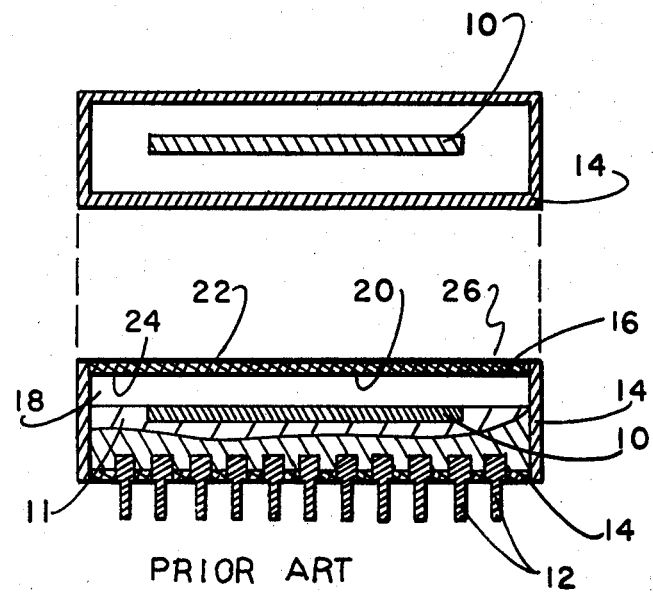
FIG. 1 is a cross-sectional view of a prior art self-scanned photosensor array.
Figure 2:
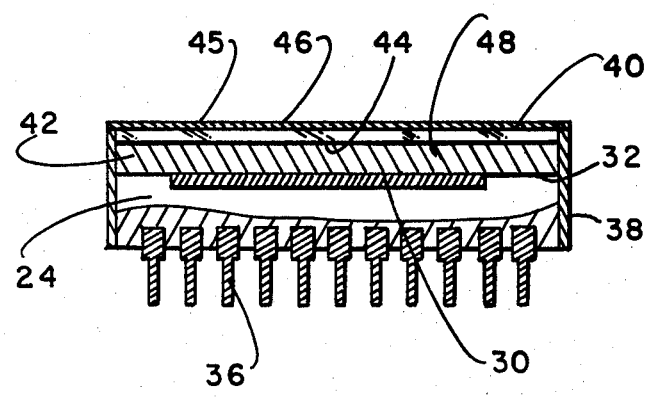
FIG. 2 is a cross-sectional view of apparatus arranged according to the invention.

Referring to FIG. 2, there is shown a cross-sectional view of an array of photodiodes 30 mounted on a top surface 32 of a suitable substrate 34 such as glass. The array 30 and associated integrated electrical circuitry are encapsulated in a plastic case 38, and covered by a sheet 40 of transparent material, such as glass and, equipped with external connection means 36. A cavity 42 is formed between an inside surface 44 of the cover 40 and the array 30. An antireflection coating 45, such as magnesium fluoride, is deposited on a top 46 or outer surface of the cover 40 to substantially match the index of refraction of the material forming the cover 40 to air. The inner surface 44 of the cover may be covered with the antireflection coating 45 for the same purpose. The antireflection coating 45 is arranged to reduce unwanted reflections, and thereby improves the effective resolution of the image characterized by the array output electrical signal by reducing flare and may be at least one layer of dielectric coating.

Alternatively, the cavity 42 between the cover 40 and array 30 may be filled with an index of refraction matching fluid 48 or other medium having an index of refraction approximately or substantially matching that of the material forming cover 40. The fluid 48 is inert chemically and physically so that it does not affect the photodiode array 30. An example of such a fluid is chlorobenzene with an index of refraction, 1.523. The index of refraction of a suitable glass cover should be as close as possible to this value.

In an alternative embodiment, the cavity 42 is filled with a gelatinous or solid substance having a coefficient of thermal expansion selected to avoid causing physical damage to the array photodiodes 30 and associated wiring 36 due to varying environmental conditions. Like the fluid 48, the gelatinous or solid substance is also inert chemically and physically so that it does not affect the photodiode array 30. The index of refraction of the gelatinous or solid substance approximates or substantially matches the index of refraction of the transparent material forming the cover 40. An example of a suitable solid substance is clear optical epoxy having an index of refraction of approximately 1.5.

Additives may be added to the medium filling the cavity 42 to affect the spectral range of the transmitted light. For example, a suitable dye such as a mixture of copper sulfate, mannite and cobalt ammonium sulfate in water, could be added to the fluid 48 to modify the spectral transmission to optimize the system for the spectral response of the photodiode array 30, and to eliminate unwanted light or emphasize the transmission of a preferred light band.

There has been described novel methods and apparatus for reducing flare in a photodiode array. It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the method and apparatus herein disclosed.

What is claimed is:

1. Apparatus comprising:
   a housing having a cover of transparent material with a predetermined index of refraction;
   an array of photosensors deposited in a space within said housing beneath said cover; and index matching means having an index of refraction substantially the same as that of said index of refraction of said cover, said index matching means being deposited in said space between said cover and said array of photosensors for reducing internal reflections in said housing.

2. Apparatus according to claim 1, and further including an antireflection coating covering a surface of said cover to substantially match said index of refraction of said cover to air.

3. Apparatus according to claim 2, wherein said antireflection coating covers an outer surface of said cover.

4. Apparatus according to claim 2, wherein said antireflection coating covers an inner surface of said cover.

5. Apparatus according to claim 2, wherein said antireflection coating is at least one layer of dielectric coating.

6. Apparatus according to claim 1, wherein said cover is glass.

7. Apparatus according to claim 1, wherein said index matching means is a fluid.

8. Apparatus according to claim 7, wherein dyes are added to said fluid to affect spectral transmission and spectral response of said photosensors.

9. Apparatus according to claim 1, wherein said index matching means is a liquid.

10. Apparatus according to claim 1, wherein said index matching means is a solid substance.

* * * * *